(12) United States Patent
Jeong et al.

(10) Patent No.: US 8,338,877 B2
(45) Date of Patent: Dec. 25, 2012

(54) NONVOLATILE MEMORY DEVICES AND METHODS OF FORMING THE SAME

(75) Inventors: Yongsik Jeong, Suwon-si (KR); Jeonguk Han, Suwon-si (KR); Weonho Park, Hwaseong-si (KR); Byungsup Shim, Yongin-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 573 days.

(21) Appl. No.: 12/588,316

(22) Filed: Oct. 13, 2009

(65) Prior Publication Data

US 2010/0090267 A1    Apr. 15, 2010

(30) Foreign Application Priority Data

Oct. 13, 2008  (KR) .................... 10-2008-0100303

(51) Int. Cl.
  *H01L 29/788*  (2006.01)
(52) U.S. Cl. ............... 257/315; 257/314; 257/E21.662; 257/E21.679
(58) Field of Classification Search .................. 257/314, 257/315, E21.662, E21.679
  See application file for complete search history.

(56) References Cited

U.S. PATENT DOCUMENTS

| 6,380,032 B1 | 4/2002 | Lee et al. | |
| 2004/0222460 A1* | 11/2004 | Lin | 257/331 |
| 2007/0131979 A1 | 6/2007 | Fujimoto | |
| 2009/0052250 A1* | 2/2009 | Kawashima et al. | 365/185.13 |

FOREIGN PATENT DOCUMENTS

| JP | 2001-223284 | 8/2001 |
| JP | 2006-196688 | 7/2006 |
| JP | 2007-149963 | 6/2007 |
| KR | 10-0356773 | 10/2002 |

OTHER PUBLICATIONS

An English language abstract of Korean Publication No. KR 10-2001-0081246, published Aug. 29, 2001.

* cited by examiner

*Primary Examiner* — N Drew Richards
*Assistant Examiner* — Yu-Hsi D Sun
(74) *Attorney, Agent, or Firm* — Harness, Dickey & Pierce, P.L.C.

(57) ABSTRACT

Nonvolatile memory devices and methods of forming the same are provided, the nonvolatile memory devices may include first regions and second regions which extend in a first direction and are alternately disposed in a semiconductor substrate along a second direction crossing the first direction. Buried doped lines are formed at the first regions respectively and extend in the first direction. The buried doped lines may be doped with a dopant of a first conductivity type. Bulk regions doped with a dopant of a second conductivity type and device isolation patterns are disposed along the second direction. The bulk regions and the device isolation patterns may be formed in the second regions. Word lines crossing the buried doped lines and the bulk regions are formed parallel to one another. Contact structures are connected to the buried doped lines and disposed between the device isolation patterns. Sidewalls of the device isolation patterns disposed in the first direction overlap with the word lines directly adjacent to the contact structures.

8 Claims, 13 Drawing Sheets

NONVOLATILE MEMORY DEVICES AND METHODS OF FORMING THE SAME

CROSS-REFERENCE TO RELATED APPLICATIONS

This U.S. non-provisional patent application claims the benefit of priority under 35 U.S.C. §119 from Korean Patent Application No. 10-2008-0100303, filed on Oct. 13, 2008, the entire contents of which is herein incorporated by reference in its entirety.

BACKGROUND

1. Field

Example embodiments disclosed herein relate to semiconductor devices and methods of forming the same. Other example embodiments relate to nonvolatile memory devices and methods of forming the same.

2. Description of Related Art

As the integration of a semiconductor device increases, the width of patterns and spaces between the patterns are reduced. A reduction in the width of patterns, or in the spaces between the patterns, results in an increase in the costs associated with manufacturing a semiconductor device. Exposure equipment that uses a corresponding short wavelength may be necessary to form a pattern having a reduced line width. However, exposure equipment that produces a pattern having a reduced line width is costly, thereby increasing the costs associated with manufacturing the semiconductor device.

A reduction in the width of the patterns and the spaces of the patterns causes a variety of difficulties in manufacturing a semiconductor device. For example, a reduction in the space between gate patterns makes it difficult to form a source plug and a drain plug connected to a source electrode and a drain electrode, respectively, of a transistor. Because a bit line is formed to cross a source line, the bit line is not formed on the same layer as the source line. And, at least one of the bit line and the source line is connected to a drain electrode or a source electrode through plugs. In this case, a space between the gate patterns should be formed wide enough to prevent (or reduce the likelihood of) a short between a plug and a gate electrode. The necessity of wide space hinders the ability to form a more integrated semiconductor device.

In the case of a conventional NOR-type flash memory device, because the source electrodes are connected to one another through a buried source line, the number of source plugs may be reduced. Because the drain electrodes of cells are connected to a bit line through drain plugs, a NOR-type flash memory device has a lower degree of integration than a NAND-type flash memory device.

Methods that reduce the number of drain plugs have been studied.

SUMMARY

Example embodiments disclosed herein relate to semiconductor devices and methods of forming the same. Other example embodiments relate to nonvolatile memory devices and methods of forming the same.

Example embodiments provide a nonvolatile memory device including first regions and second regions extending in a first direction. The first and second regions may be alternately disposed in a semiconductor substrate along a second direction crossing the first direction. The nonvolatile memory device includes buried doped lines formed at the first regions respectively and extending in the first direction. The buried doped lines may be doped with a dopant of a first conductivity type. The non-volatile memory device includes bulk regions doped with a dopant of a second conductivity type and device isolation patterns disposed along the second direction. The bulk regions and the device isolation patterns may be formed in the second regions. Word lines crossing the buried doped lines and the bulk regions may be formed parallel to one another. Contact structures may be connected to the buried doped lines and disposed between the device isolation patterns. Sidewalls of the device isolation patterns disposed in the first direction overlap with the word lines directly adjacent to the contact structures.

Other example embodiments provide a method of forming a nonvolatile memory device. The method may include providing a semiconductor substrate including first regions and second regions extended in a first direction. The first and second regions may be alternately disposed along a second direction crossing the first direction. Bulk regions doped with a dopant of a second conductivity type, and device isolation patterns, may be formed disposed along a second direction crossing the first direction. The bulk regions and the device isolation patterns may be formed in the second regions. Buried doped lines may be formed at the first regions respectively and extend in the first direction. The buried doped lines may be doped with a dopant of a first conductivity type. Word lines crossing the buried doped lines and the bulk regions may be formed parallel to one another. Contact structures may be connected to the buried doped lines between the device isolation patterns. Sidewalls of the device isolation patterns disposed in the first direction overlap with the word lines directly adjacent to the contact structures.

BRIEF DESCRIPTION OF THE FIGURES

Example embodiments will be more clearly understood from the following detailed description taken in conjunction with the accompanying drawings. FIGS. 1-11 represent non-limiting, example embodiments as described herein.

FIG. 1 is a top plan view of a nonvolatile memory device according to example embodiments.

FIG. 2 is a cross sectional view taken along the line I-I' of FIG. 1.

FIG. 3 is a cross sectional view taken along the line II-II' of FIG. 1.

FIG. 4 is a cross sectional view taken along the line III-III' of FIG. 1.

FIG. 5 is a top plan view of a nonvolatile memory device according to example embodiments.

FIG. 6 is a cross sectional view taken along the line VI-VI' of FIG. 5.

FIGS. 7a through 9c are views illustrating a method of forming a nonvolatile memory device according to example embodiments.

FIGS. 7c, 8c and 9c are cross sectional views taken along the line VI-VI' of FIGS. 7a, 8a and 9a, respectively.

FIG. 10 is a block diagram of an electronic system including a nonvolatile memory device according to example embodiments.

FIG. 11 is a blocking diagram of a memory card including a nonvolatile memory device according to example embodiments.

DETAILED DESCRIPTION OF EXAMPLE EMBODIMENTS

Figure 1:
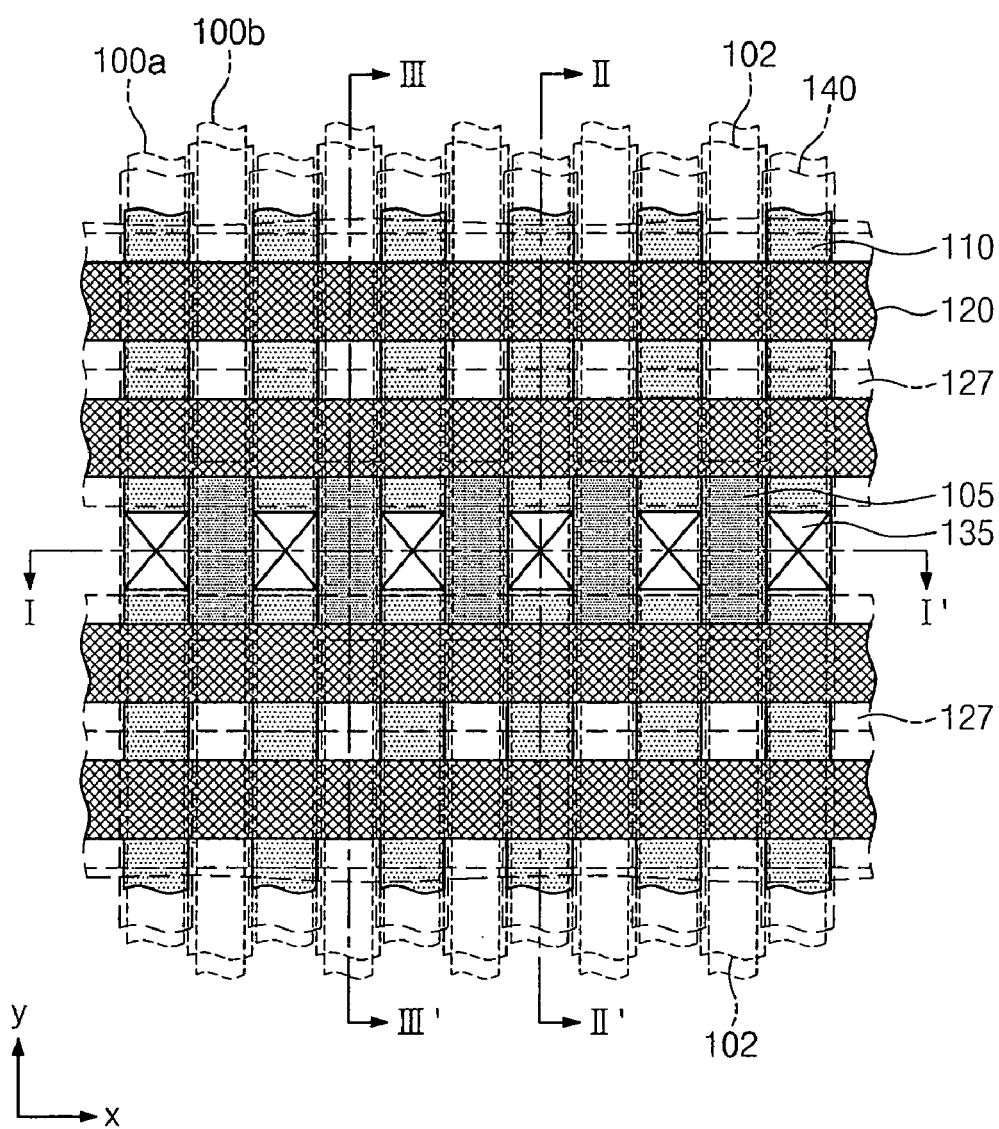

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments disclosed herein relate to semiconductor devices and methods of forming the same. Other example embodiments relate to nonvolatile memory devices and methods of forming the same.

Figure 2:
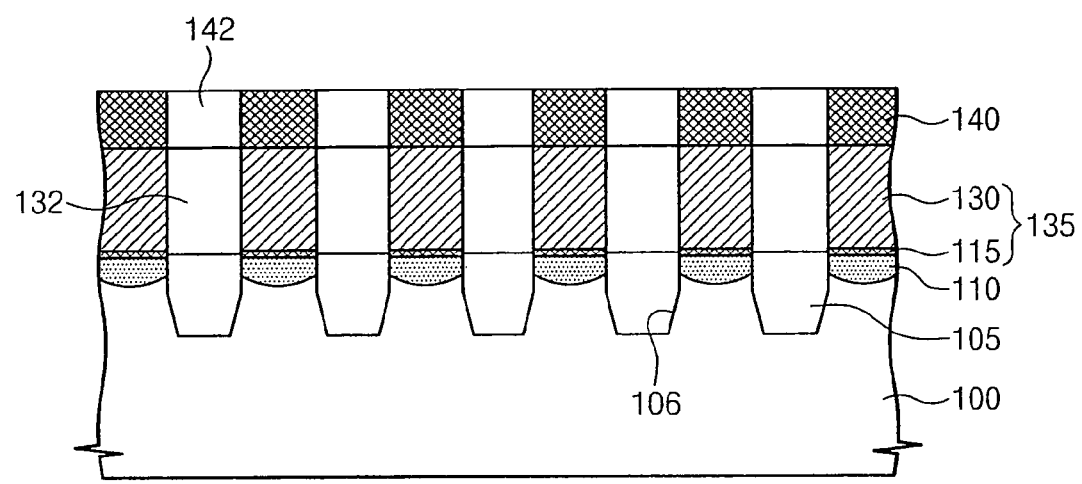
Figure 3:
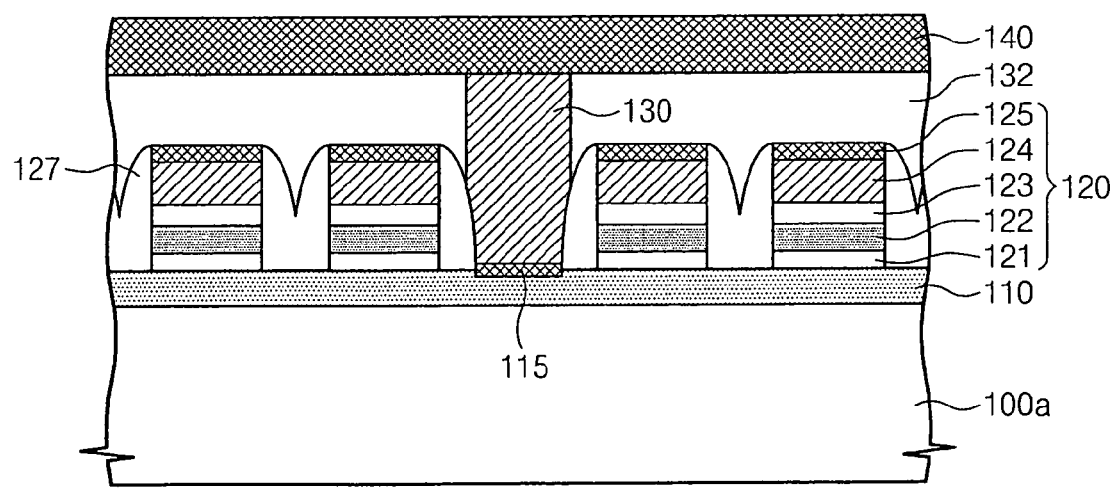
Figure 4:
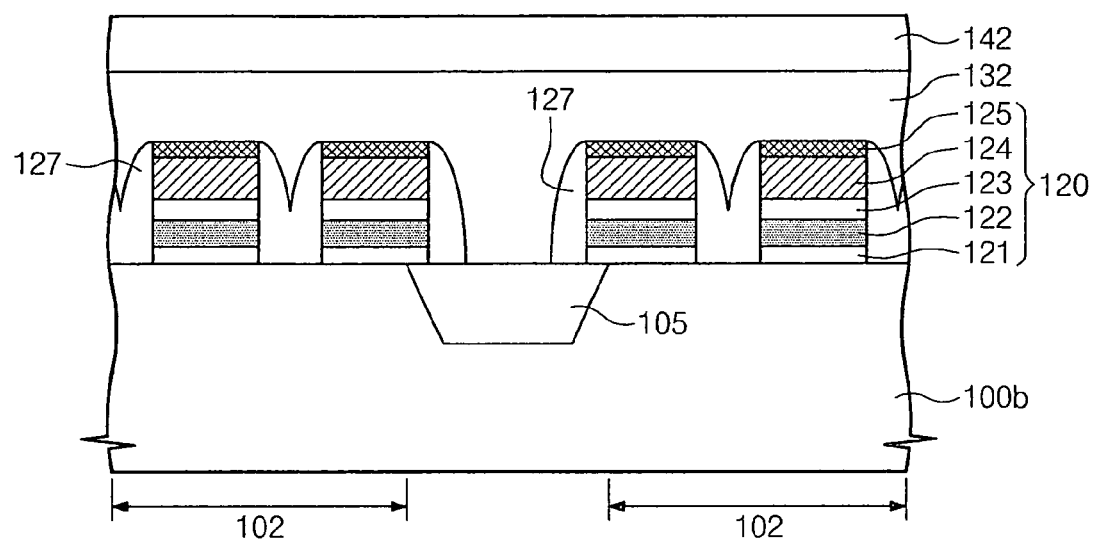

FIG. 1 is a top plan view of a nonvolatile memory device according to example embodiments. FIG. 2 is a cross sectional view taken along the line I-I' of FIG. 1. FIG. 3 is a cross sectional view taken along the line II-II' of FIG. 1. FIG. 4 is a cross sectional view taken along the line III-III' of FIG. 1.

Referring to FIGS. 1 and 2, first regions 100a and second regions 100b which extend parallel to each other along a first direction and alternately disposed in a second direction crossing the first direction, are provided in a semiconductor substrate 100. As depicted in FIG. 1, the first direction corresponds to the direction extending along the y-axis and the second direction corresponds to the direction extending along the x-axis. Buried doped lines 110 are disposed on the first regions 100a respectively. The buried doped lines 110 extend in the first direction and include a dopant of a first conductivity type. The buried doped lines 110 may be disposed on a surface of the semiconductor substrate 100. Top surfaces of the buried doped lines 110 may be substantially coplanar with a top surface of the semiconductor substrate 100. The first conductivity type may be an n-type impurity.

Bulk regions 102 and device isolation patterns 105 are disposed in the second regions 100b. The bulk regions 102 may include a dopant of a second conductivity type. The device isolation patterns 105 are disposed along the second direction crossing the first direction. The bulk regions 102 are regions in which the device isolation patterns 105 are not disposed. The second conductivity type may be a p-type impurity. The device isolation patterns 105 may include a silicon oxide layer. Word lines 120 may cross the buried doped lines 110 and the bulk regions 102. Contact structures 135 may be connected to the buried doped lines 110. The contact structures 135 may be disposed between the device isolation patterns 105.

The device isolation patterns 105 are disposed in the semiconductor substrate 100 along the second direction. The device isolation patterns 105 may be a silicon oxide layer. For example, the device isolation patterns 105 may include a HDP oxide layer formed using a high density plasma (HDP) technique, a spin-on-glass (SOG) layer, a medium temperature oxide (MTO) layer, a high temperature oxide (HTO) layer, an undoped silicon layer and/or an undoped germanium layer.

The device isolation patterns 105 may include a silicon oxide layer (not shown) formed in inner wall of a trench 106 through a thermal oxidation process. The device isolation patterns 105 may include a liner (not shown) covering an inner wall of the trench 106. The liner may be a material (e.g., a silicon nitride layer) which prevents impurities from penetrating into the semiconductor substrate 100.

A portion of the buried doped lines 110 is disposed between the device isolation patterns 105. The other portion of the buried doped lines 110 is disposed between the bulk regions 102. The buried doped lines 110 may be used as source electrodes of the word lines 120, drain electrodes of the word lines 120, source lines connecting the source electrodes and bit lines connecting the drain electrodes. A unit cell of the nonvolatile memory device may include two buried doped lines 110. One of the two buried doped lines 110 may be used as a source region and a source line, and the other of the two buried doped lines 110 may be used as a drain region and a bit line.

A first interlayer insulating layer 132 covering the word lines 120 and the device isolation patterns 105 is provided. Contact structures 135 connected to the buried doped lines 110 between the device isolation patterns 105 may be disposed in the first interlayer insulating layer 132. The width of the buried doped lines 110 to which the contact structures 135 are connected may be defined by the device isolation patterns 105. The contact structures 135 may include a first silicide layer 115 which is in contact with the buried doped lines 110 and a metal contact 130 connected to the first silicide layer 115. The first silicide layer 115 is provided for an ohmic contact of the buried doped lines 110 and the metal contact 130.

Even if widths of the second direction of the buried doped lines 110 are smaller than widths of the second direction of the contact structures 135, a short between the contact structures 135 and the semiconductor substrate 100 may be prevented (or the likelihood reduced) by the device isolation patterns 105. As the widths of the buried doped lines 110 in the second direction are reduced, a scaling down may be possible. A second interlayer insulating layer 142 is provided onto (or on) the first interlayer insulating layer 132. Global bit lines 140, which are connected to the contact structures 135 and extend in the first direction, are provided onto (or on) the second interlayer insulating layer 142.

A resistance characteristic of a nonvolatile memory device according to example embodiments increases due to the first silicide layer 115. The first silicide layer 115 may be self-aligned on the buried doped lines 110 by the device isolation patterns 115.

Referring to FIGS. 3 and 4, a top surface of the bulk region 102 of the semiconductor substrate 100 may be coplanar with a top surface of the buried doped line 110. The word lines 120 may include a tunnel insulating layer 121, a charge storage layer 122, a dielectric layer 123 and a gate electrode 124 that are sequentially stacked on the semiconductor substrate 100. The charge storage layer 122 may be a floating gate or a charge trap layer. For example, the charge trap layer may be a silicon nitride layer having a high charge trap density or a high dielectric layer having a high charge trap density. The dielectric layer 123 may be an inter-gate insulating layer if the charge storage layer 122 is a floating gate and may be a blocking insulating layer preventing charges from leaking into the gate electrode 124 if the charge storage layer 122 is a charge trap layer. If the gate electrode 124 includes polysilicon, the word lines 120 may further include a second silicide layer 125 on the gate electrode 124.

The word line 120 directly adjacent to the contact structures 135 may cover a portion of the device isolation pattern 105. The device isolation pattern 105 is disposed at one side of the adjacent word line 120 and the buried doped line 110. The bulk region 102 are disposed at the other side of the adjacent word line 120 facing the one side. This arrangement prevents a silicide layer from being disposed between the word line 120 directly adjacent to the contact structure 135 and the device isolation pattern 105. The word line 120 directly adjacent to the contact structure 135 may be used as a dummy word line. The word line 120 may include a spacer 127. Sidewalls of the device isolation patterns disposed in the first direction overlap with the word lines directly adjacent to the contact structures. The spacer 127 may include a silicon oxide layer, a silicon nitride layer, a silicon oxynitride layer or combinations thereof. The spacers 127 may cover the buried doped lines 110 and the bulk regions 102 between the word lines 120 so that the buried doped lines 110 and the bulk regions 102 are not exposed. The spacer 127 of the dummy word line comprises first spacers on one sidewall of the dummy word lines and second spacers on other sidewall of the dummy word lines. The first spacers may be directly adjacent to the contact structure 135.

Figure 5:
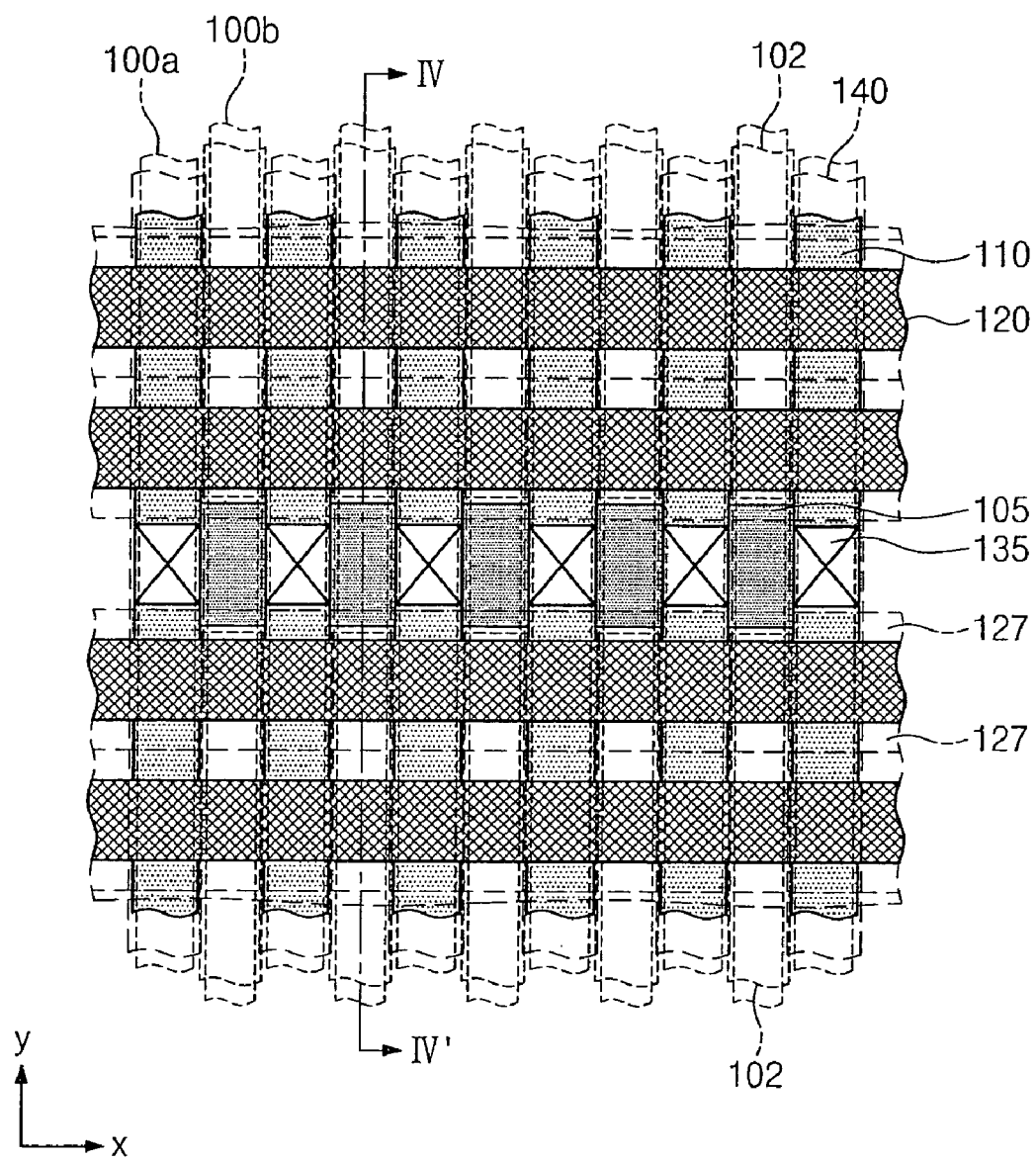
Figure 6:
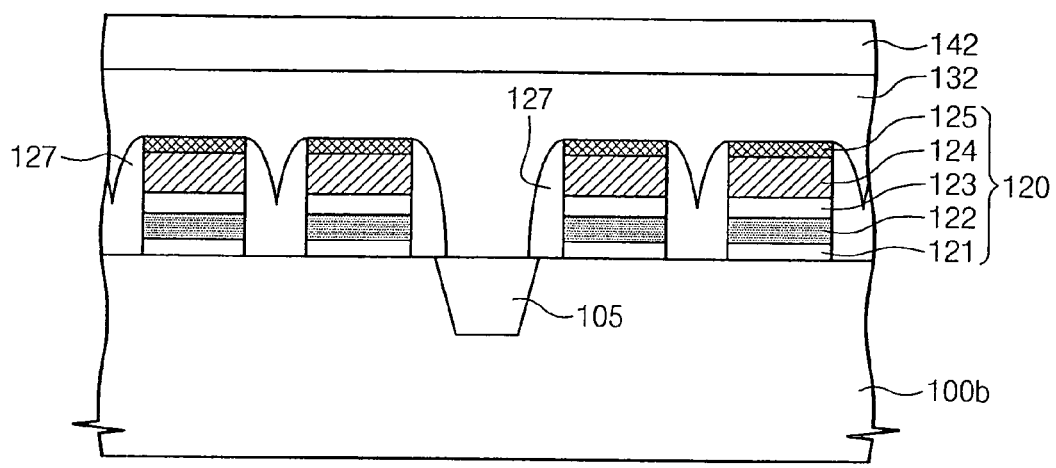

FIG. 5 is a top plan view of a nonvolatile memory device according to example embodiments. FIG. 6 is a cross sectional view taken along the line VI-VI' of FIG. 5.

Referring to FIGS. 5 and 6, unlike in FIGS. 1 and 4, word lines 120 adjacent to the contact structures 135 may not cover the device isolation patterns 105 and may be spaced apart from one another. The spacer 127 may cover a buried doped line 110 and a bulk region 102 between the adjacent word line 120 and the device isolation pattern 105. Sidewalls of the device isolation pattern 105 may overlap with the first spacers of the dummy word line. The second spacers may cover the bulk region 102.

This arrangement prevents a silicide layer from being disposed at the separated portion. The word lines 120 directly adjacent to the contact structures 135 may not be used as dummy word lines unlike other example embodiments.

According to example embodiments, the device isolation patterns 105 are disposed between the contact structures 135. A first silicide layer 115 may be self aligned on the buried doped patterns 110 by the device isolation patterns 105. An interconnection resistance may be reduced by a disposal of the first silicide layer 115. A short between the semiconductor substrate 100 and the contact structures 135 may be prevented by the device isolation patterns 105. The second silicide layer 125 is disposed on the gate electrode 124 of the word lines 120 to reduce a resistance between the word line 120 and a metal interconnection, which is connected to the word line 120.

Figure 7A:
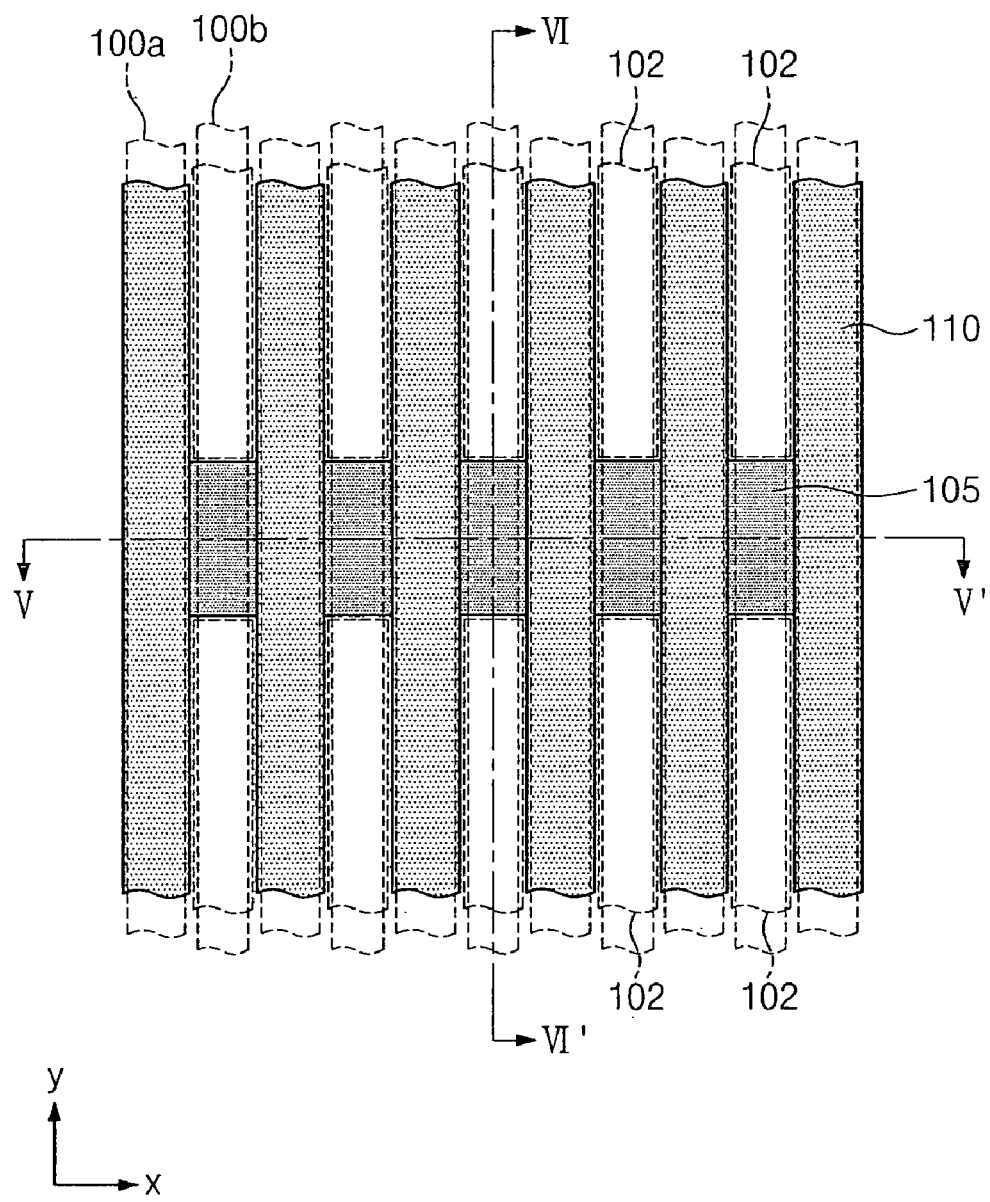
Figure 7B:
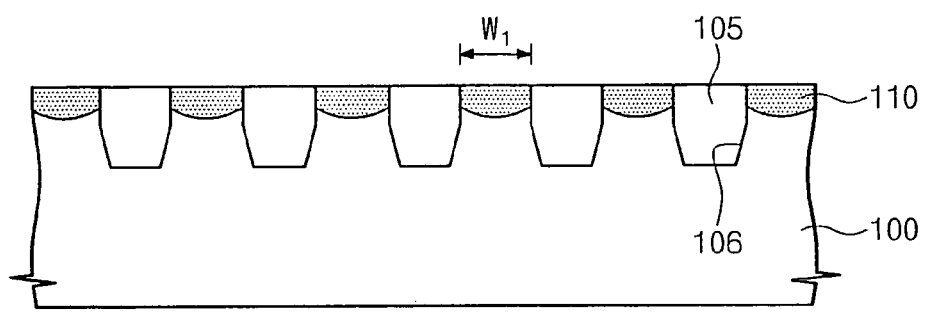
FIGS. 7b, 8b and 9b are cross sectional views taken along the line V-V' of FIGS. 7a, 8a and 9a, respectively.
Figure 7C:
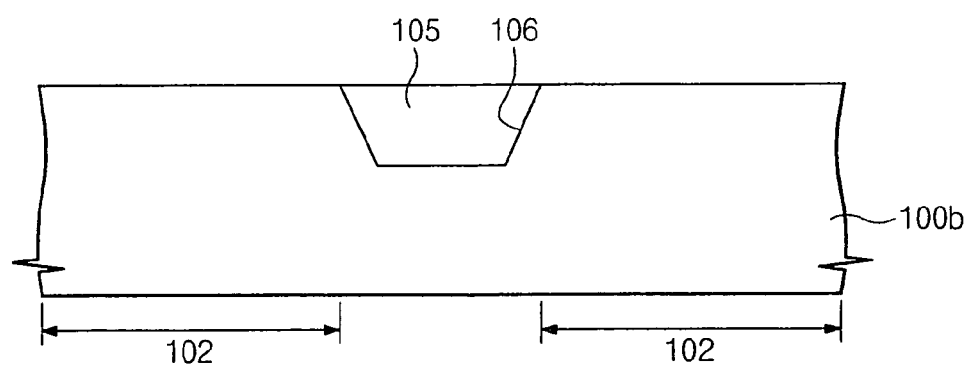
Figure 8A:
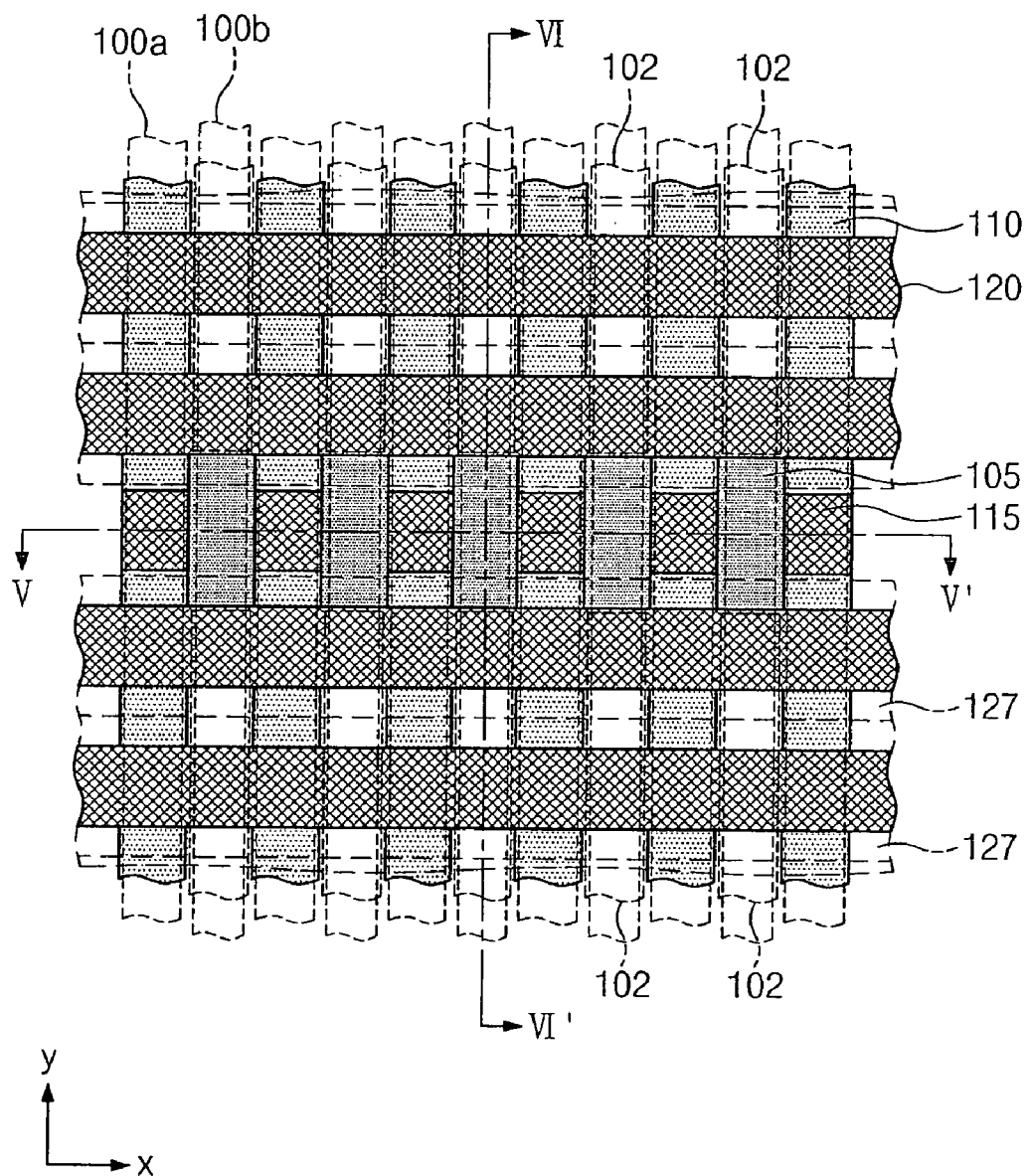
Figure 8B:
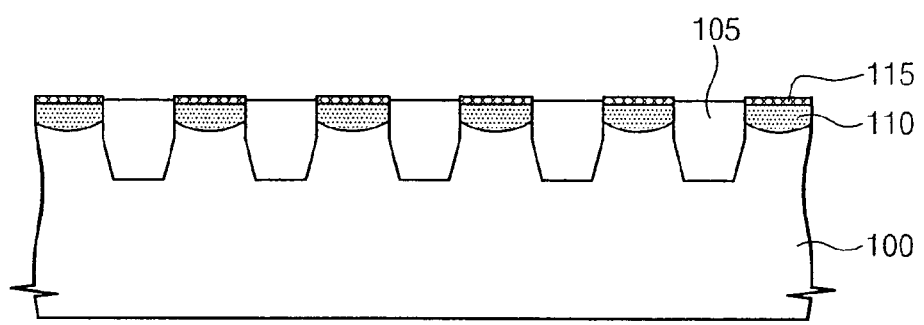
Figure 8C:
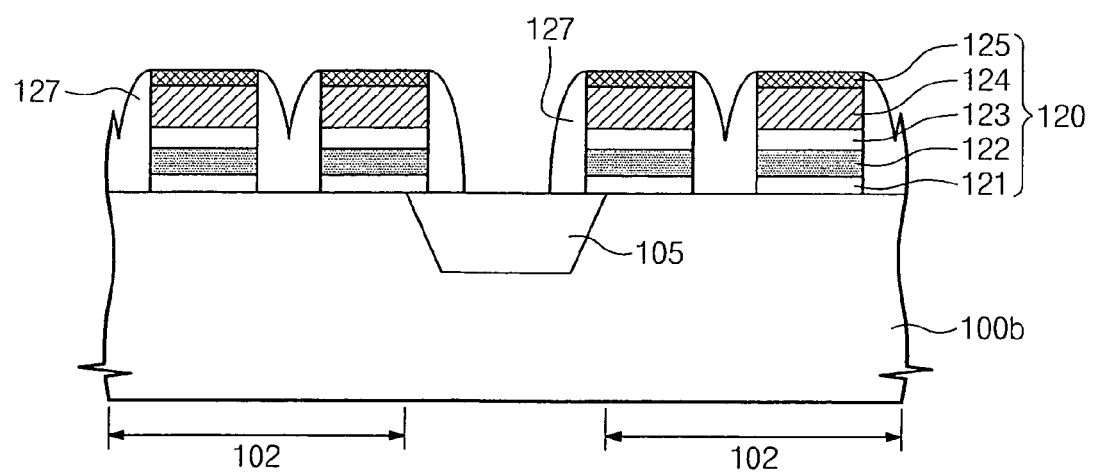
Figure 9A:
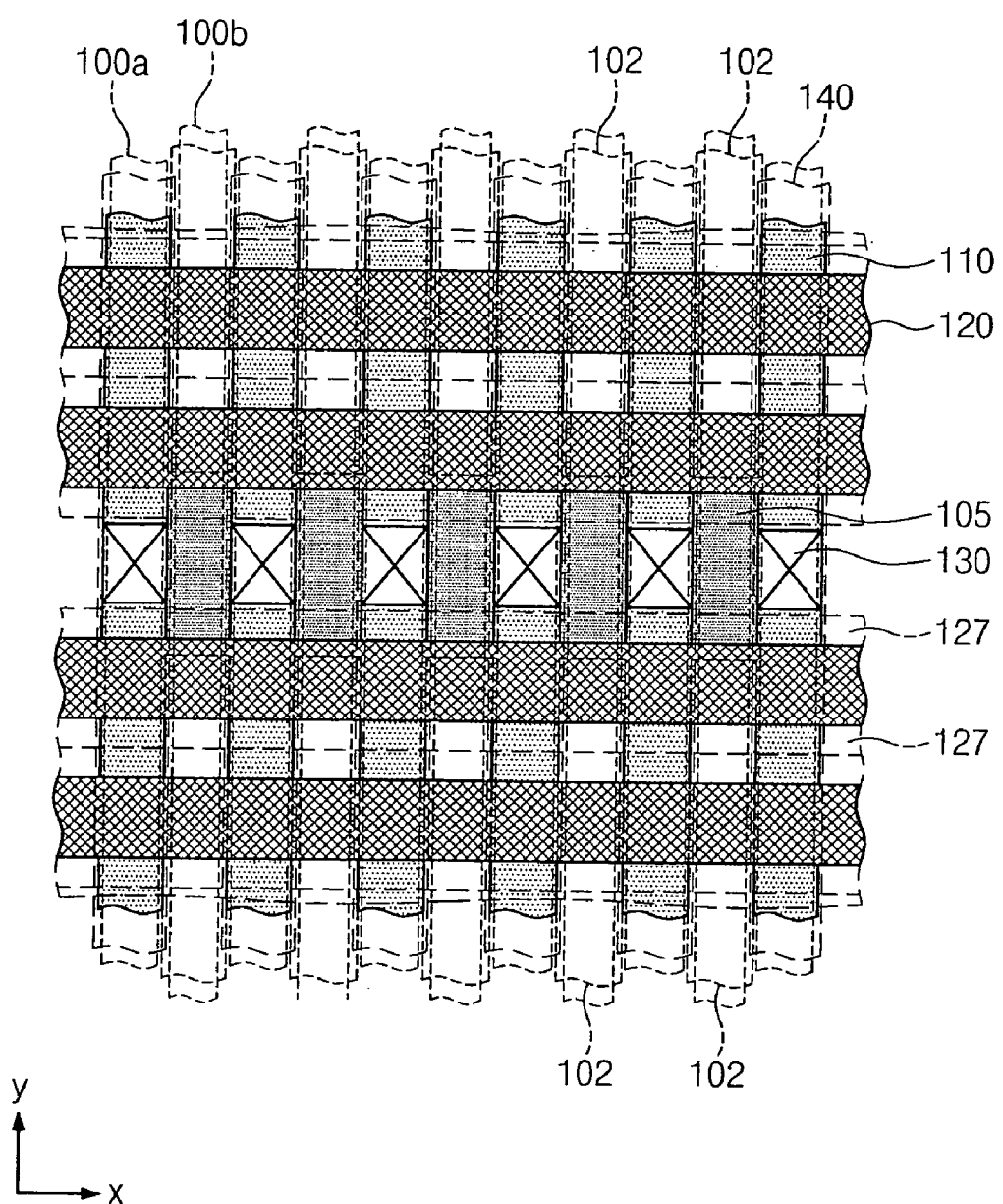
Figure 9B:
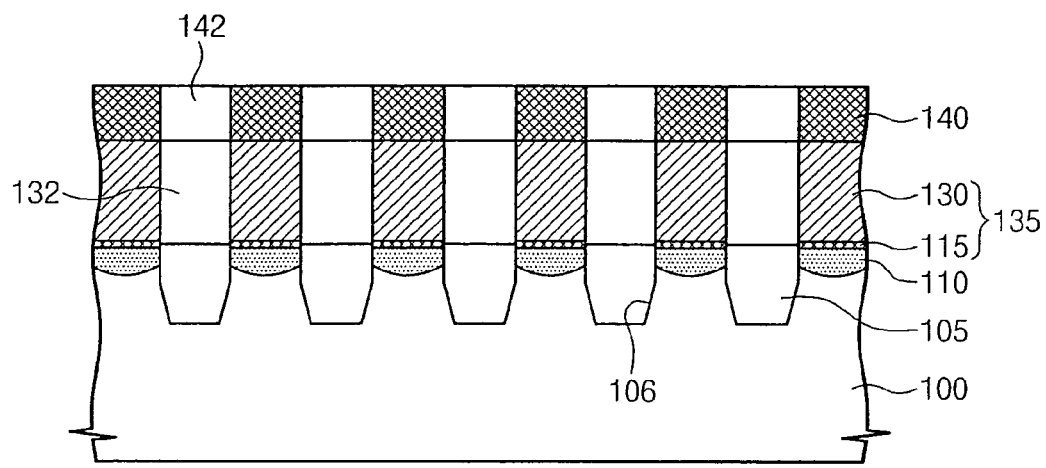
Figure 9C:
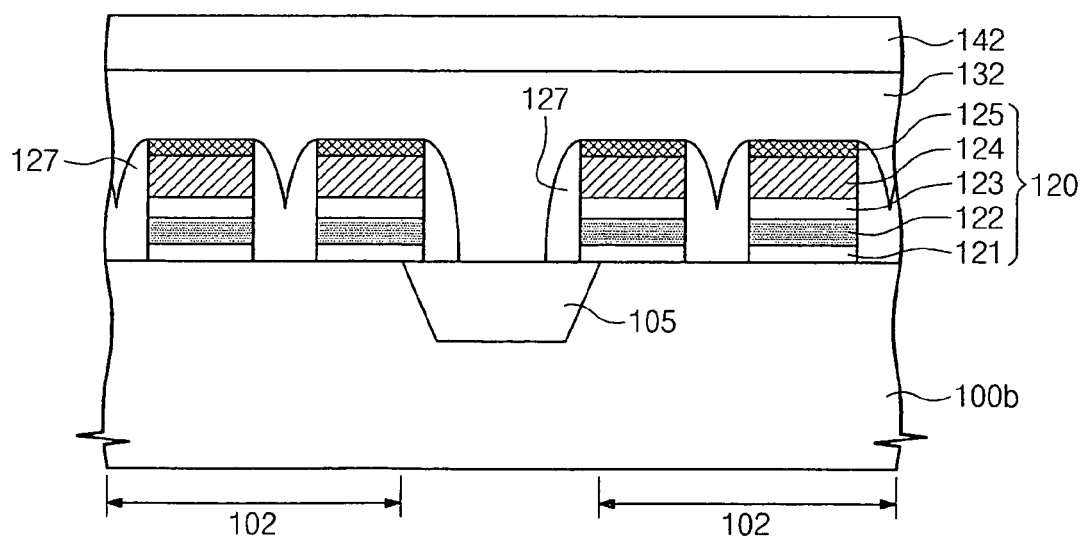

Referring to FIGS. 7a through 9c, a method of forming a nonvolatile memory device according to example embodiments will be described. FIGS. 7b, 8b and 9b are cross sectional views taken along the line V-V' of FIGS. 7a, 8a and 9a, respectively. FIGS. 7c, 8c and 9c are cross sectional views taken along the line VI-VI' of FIGS. 7a, 8a and 9a, respectively.

Referring to FIGS. 7a, 7b and 7c, a semiconductor substrate 100 including first regions 100a and second regions 100b which extend in a first direction (e.g., along the y-axis) and alternately disposed is provided. Buried doped lines 110 formed in the first regions 100a, extending in the first direction and doped with a dopant of a first conductivity type, are formed. The dopant of a first conductivity type may be an n-type. The buried doped lines 110 may be formed by performing an ion implantation process using an ion implantation mask (not shown) extending in the first direction.

Bulk regions 102 doped with a dopant of a second conductivity type and device isolation patterns 105 disposed to extend in a second direction (e.g., along the x-axis) crossing the first direction are formed in the second regions 100b. The bulk region 102 is a region in which the device isolation patterns are not disposed. The dopant of a second conductivity type may be a p-type.

Forming the device isolation patterns 105 may include forming a trench 106 in the semiconductor substrate 100 and forming an insulating layer (not shown) filling the trench 106. The insulating layer may, for example, be a silicon oxide layer. The device isolation patterns 105 may include a liner oxide layer (not shown) formed by applying a thermal oxidation process to an inner wall of the trench 106. The device isolation patterns 105 may include a liner nitride layer (not shown) formed to cover at least the inner wall of the trench 106. The liner nitride layer may prevent impurities from penetrating into the semiconductor substrate 100.

The device isolation patterns 105 are formed, followed by forming the buried doped lines 110. The device isolation patterns 105 are formed at regular intervals, followed by arranging the buried doped lines 110 between the device isolation patterns 105 using an ion implantation process. As such, a distance between the device isolation patterns 105 may define a width ($W_1$, a width measured along a second direction crossing the first direction) of the buried doped line 110 between the device isolation patterns 105.

Referring to FIGS. 8a, 8b and 8c, word lines 120 crossing the buried doped lines 110 and the bulk regions 102 in parallel to one another are formed. The word lines 120 may be formed of a tunnel insulating layer 121, a charge storage layer 122, a dielectric layer 123 and a gate electrode 124 that are sequentially stacked on the semiconductor substrate 100. The gate electrode 124 may be formed of polysilicon.

A spacer 127 is formed on a sidewall of the word line 120. The spacer 127 may be formed of a silicon oxide layer, a silicon nitride layer, a silicon oxynitride layer or a combination thereof. An insulating layer is deposited using a chemical vapor deposition (CVD) process, followed by performing an anisotropic etching process. As such, the spacer 127 may be formed. After forming the spacer 127, a first silicide layer 115 is formed on the buried doped lines 110 between the device isolation patterns 105. Forming the first silicide layer 115 may include forming a metal layer covering the word lines 120 and the buried doped lines 110, forming the first silicide layer 115 on the buried doped lines 110 by applying an annealing process to the metal layer and removing an unreacted metal layer. A space between the word lines 120 may not be exposed by the spacer 127.

If the gate electrode 124 is formed of polysilicon, the word lines 120 may include a second silicide layer 125 on the gate electrode 124. The first and second silicide layers 115 and 125 may be formed simultaneously (or at the same time).

According to example embodiments, the word line 120 directly adjacent to the device isolation pattern 105 may be formed to cover a portion of the device isolation pattern 105. The word line 120 covering a portion of the device isolation pattern 105 may be used as a dummy word line. In other example embodiments, the word line 120 directly adjacent to the device isolation pattern 105 may be formed not to cover a portion of the device isolation pattern 105 (referring to FIGS. 5 and 6). A separated space between the word line 120 directly adjacent to the device isolation pattern 105 and the device isolation pattern 105 may be covered by the spacer 127. This arrangement prevents a silicide layer from forming in the separated space.

Referring to FIGS. 9a, 9b and 9c, a first interlayer insulating layer 132 is formed covering the word lines 120. The first interlayer insulating layer 132 may be formed of a silicon oxide layer. A metal contact 130 electrically connected to the first silicide layer 115 is formed on the first interlayer insulating layer 132. The metal contact 130 and the first silicide layer 115 may constitute contact structures 135. The metal contact 130 and the buried doped lines 110 may constitute an ohmic contact by the first silicide layer 115. A second interlayer insulating layer 142 is formed on the first interlayer insulating layer 132. Global bit lines 140 connected to the contact structures 135 are formed on the second interlayer insulating layer 142. The global bit lines 140 may extend in the first direction and may have a low interconnection resistance by the first silicide layer 115.

According to example embodiments, the first silicide layer 115 may be formed by using the device isolation patterns 105. The first silicide layer 115 may be self-aligned with the buried doped lines 110 by the device isolation patterns 105. Even if the contact structures 135 are misaligned, the device isolation patterns 105 may prevent (or reduce the likelihood of) a short between the semiconductor substrate 100 and the contact structures 135. A silicide process according to example embodiments and a silicide process of a transistor disposed at a peripheral region of the nonvolatile memory device may be performed simultaneously.

Figure 10:
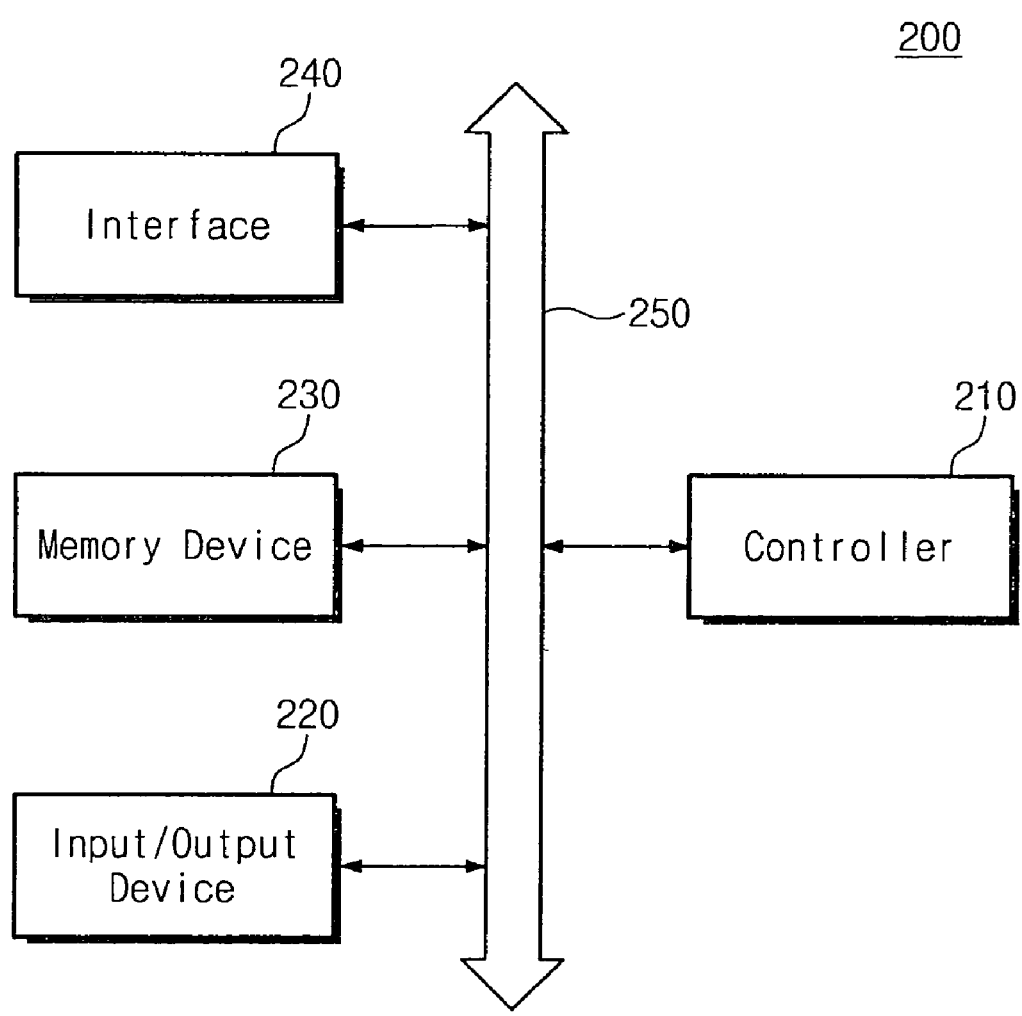

FIG. 10 is a block diagram of an electronic system including a nonvolatile memory device according to example embodiments.

Referring to FIG. 10, an electronic system 200 may include a controller 210, an input/output device 220 and a memory device 230. The controller 210, the input/output device 220 and the memory device 230 may be connected to one another through a bus 250. The bus 250 may be a path through which data transfer. The controller 210 may include at least one of a micro processor, a digital signal processor, a microcontroller and a logic device having a function similar to the micro processor, the digital signal processor and the microcontroller. The input/output device 220 may include at least one selected from a keypad, a keyboard and a display device. The memory device 230 is a device storing data. The memory device 230 may store data and/or an instruction executed by the controller 210. The memory device 230 may include the nonvolatile memory device disclosed in example embodiments. The electronic system 200 may include an interface 240 for transmitting data to a communication network or receiving data from a communication network. The interface 240 may be a wireline/wireless shape. The interface 240 may include an antenna or a wireline/wireless transceiver. The electronic system 200 may be embodied by a mobile system, a personnel computer, an industrial computer or a logic system performing a variety of functions. For example, the mobile system may be one of a personal digital assistant (PDA), a portable computer, a web tablet, a mobile phone, a wireless phone, a laptop computer, a memory card, a digital music system and a data transmission/receipt system. If the electronic system 200 is a device which performs a wireless communication, the electronic system 200, may be used in a communication interface protocol of a third generation (e.g., CDMA, GSM, NADC, E-TDMA, CDMA 2000).

Figure 11:
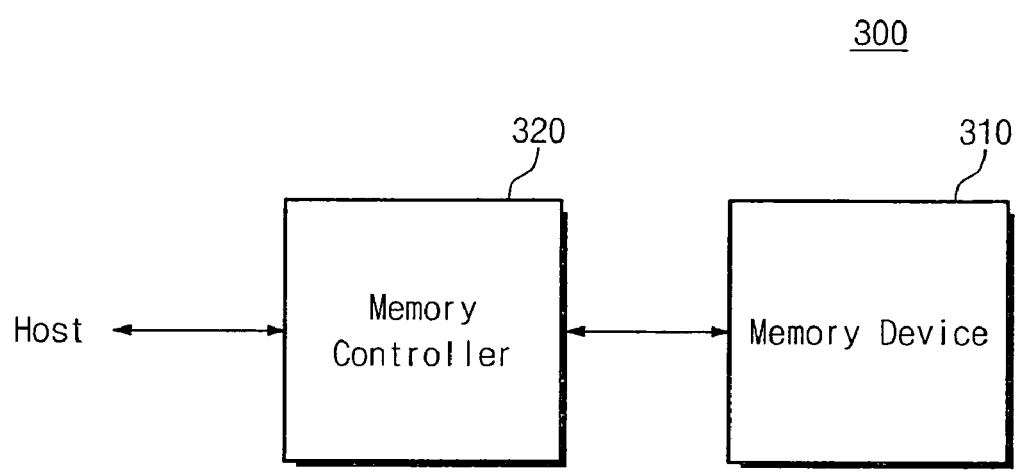

FIG. 11 is a blocking diagram of a memory card including a nonvolatile memory device according to example embodiments.

Referring to FIG. 11, a memory card 300 may include a memory device 310 and a memory controller 320. The memory device 310 stores data. The memory device 310 may have nonvolatile characteristics such as the ability to maintain stored data even if a power supply is interrupted. The memory device 310 may include the nonvolatile memory device disclosed in the described example embodiments. The memory controller 320 readouts data stored in the memory device 310 or stores data in the memory device 310 in response to a request of decoding/writing of a host.

While example embodiments have been particularly shown and described with reference to example embodiments thereof, it will be understood that various changes in form and details may be made therein without departing from the spirit and scope of the following claims.

What is claimed is:

1. A nonvolatile memory device, comprising:
   a semiconductor substrate having a plurality of first regions and a plurality of second regions extending in a first direction, wherein the plurality of first regions and the plurality of second regions are alternately disposed in the semiconductor substrate along a second direction crossing the first direction;
   a plurality of buried doped lines each in one of the first regions and extending in the first direction, wherein the buried doped lines are doped with a dopant of a first conductivity type;
   a plurality of bulk regions doped with a dopant of a second conductivity type and a plurality of device isolation patterns disposed along the second direction, wherein the plurality of bulk regions and the plurality of device isolation patterns are in the plurality of second regions;
   a plurality of word lines crossing the plurality of buried doped lines and the plurality of bulk regions, wherein the plurality of word lines are parallel to one another; and
   a plurality of contact structures connected to the plurality of buried doped lines, wherein the plurality of contact structures are disposed between the plurality of device isolation patterns,
   wherein the plurality of word lines directly adjacent to the plurality of contact structures include gate electrodes, and side walls of the device isolation patterns disposed in the first direction overlap with the gate electrodes, and
   wherein a bottom surface of the plurality of device isolation patterns is lower than a top surface of the semiconductor substrate.

2. The nonvolatile memory device of claim 1, wherein a top surface of the plurality of buried doped lines is coplanar with a top surface of the plurality of bulk regions.

3. The nonvolatile memory device of claim 1, wherein the plurality of buried doped lines are used as source electrodes of the plurality of word lines, drain electrodes of the plurality of word lines, source lines connecting the source electrodes and bit lines connecting the drain electrodes.

4. The nonvolatile memory device of claim 1, wherein each of the plurality of contact structures includes a first silicide layer in contact with the semiconductor substrate, and a metal contact connected to the first silicide layer.

5. The nonvolatile memory device of claim 4, wherein each of the plurality word lines includes a tunnel insulating layer on the semiconductor substrate, a charge storage layer on the tunnel insulating layer, a dielectric layer on the charge storage layer, and a gate electrode on the dielectric layer.

6. The nonvolatile memory device of claim 5, wherein each of the plurality of word lines includes a second silicide layer on the gate electrode.

7. The nonvolatile memory device of claim 1, wherein the word lines directly adjacent to the contact structures are dummy word lines.

8. The nonvolatile memory device of claim 1, wherein a top surface of the plurality of device isolation pattern is coplanar with a top surface of the plurality of buried lines.

* * * * *